United States Patent [19]

Nojima et al.

[11] Patent Number: 4,943,503

[45] Date of Patent: Jul. 24, 1990

[54] AMORPHOUS SILICON PHOTORECEPTOR

[75] Inventors: Hideo Nojima; Yoshimi Kojima; Eiji Imada, all of Nara; Toshiro Matsuyama; Takashi Hayakawa, both of Tenri; Shiro Narikawa, Kashihara; Shaw Ehara, Nara, all of Japan

[73] Assignee: Sharp Kabushiki Kaisha, Osaka, Japan

[21] Appl. No.: 659,418

[22] Filed: Oct. 10, 1984

[30] Foreign Application Priority Data

Oct. 13, 1983 [JP] Japan ................................ 58-192078

[51] Int. Cl.$^5$ .................... G03G 5/14; G03G 5/082
[52] U.S. Cl. ........................................ 430/66; 430/57; 430/67
[58] Field of Search ............... 430/57, 66, 67; 427/74; 252/501.1; 357/2; 313/386

[56] References Cited

U.S. PATENT DOCUMENTS

| 4,418,132 | 11/1983 | Yamazaki | 430/67 X |
| 4,460,669 | 7/1984 | Ogawa et al. | 430/57 |
| 4,460,670 | 7/1984 | Ogawa et al. | 430/57 |

FOREIGN PATENT DOCUMENTS

| 58-88753 | 5/1983 | Japan | 430/67 |
| 58-145951 | 8/1983 | Japan | 430/66 |

Primary Examiner—Roland E. Martin
Attorney, Agent, or Firm—Birch, Stewart, Kolasch & Birch

[57] ABSTRACT

An amorphous silicon (a-Si) photoreceptor includes an amorphous silicon (a-Si) photoconductive layer, and a surface layer disposed above the amorphous silicon (a-Si) photoconductive layer. An intermediate layer is disposed between the amorphous-silicon (a-Si) photoconductive layer and the surface layer to ensure the energy level matching. The intermediate layer is made of amorphous silicon (a-Si) doped with nitrogen and boron so as to have the energy difference of less than 0.2 eV between the bottom of the conduction bands of the surface layer and the intermediate layer.

10 Claims, 1 Drawing Sheet

AMORPHOUS SILICON PHOTORECEPTOR

BAKGROUND OF THE INVENTION

1. Field of the Invention

The present invention relates to a photoreceptor for an electrophotographic copying machine and, more particularly, to a photoreceptor of which the main component is amorphous silicon.

2. Description of the Prior Art

A photoreceptor for use in an electrophotographic copying machine should have a high resistance and high photosensitivity. Amorphous silicon (a-Si) has recently drawn attention as an ideal photoreceptor material because the amorphous silicon (a-Si) is pollution-free, highly photosensitive, and extremely hard (Vickers hardness: 1500–2000 Kg·mm$^{-2}$). Nevertheless, the amorphous silicon (a-Si) per se can not retain sufficient electric charges with a sufficient resistance.

One approach is to modify the amorphous silicon (a-Si) photoconductive layer so as to show a high resistance. Another approach is to provide a blocking layer, having a large energy band gap, on the surface of the amorphous silicon (a-Si) photoconductive layer, thereby holding the electric changes. The thus formed surface layer functions not only to hold the electric charges but also to protect the photoreceptor from the ambient condition.

Accordingly, the latter approach is more preferable than the former one. However, if the surface layer having a larger energy band gap is formed directly on the amorphous silicon (a-Si) photoconductive layer, energy band matching is not ensured. The ill-matching will produce a notch or dip which adversely affects the electrophotographic copying operation. More specifically, the mechanical adhesion of the deposited layer is not ensured. Furthermore, the residual potential increases, and the copied image is blurred.

In order to minimize the above-mentioned deficiencies, the present inventors have proposed a novel photoreceptor in copending U.S. patent application Ser. No. 639,015, "AMORPHOUS SILICON PHOTORECEPTOR FOR ELECTROPHOTOGRAPHY", filed on Aug. 9, 1984, wherein an intermediate layer is disposed between the amorphous silicon photoconductive layer and the surface layer. The intermediate layer has an energy band gap which is intermediate between those of the amorphous silicon (a-Si) photoconductive layer and the surface layer. The Japanese counterpart is Japanese Patent Application No. 58-154330 filed on Aug. 23, 1983. The British counterpart is British Patent Application No. 8421208 filed on Aug. 21, 1984. The German counterpart is No. P 34 30 940.3 filed on Aug. 22, 1984.

OBJECTS AND SUMMARY OF THE INVENTION

Objects of the Invention

Accordingly, an object of the present invention is to provide an improved amorphous silicon (a-Si) photoreceptor for use in an electrophotographic copying machine.

Another object of the present invention is to enhance the characteristics of an intermediate layer which is interposed between an amorphous silicon (a-Si) photoconductive layer and a surface layer.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Summary of the Invention

To achieve the above objects, pursuant to an embodiment of the present invention, nitrogen and boron are doped into the intermediate layer of which the main component is amorphous silicon (a-Si). The intermediate layer ensures the matching of the energy level.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

An amorphous silicon (a-Si) photoreceptor of the present invention includes a photoconductive layer 2, of which the main component is amorphous silicon (a-Si), deposited on a conductive substrate 1. A surface layer 3 made of an amorphous material having a large optical band gap is disposed above the photoconductive layer 2. An intermediate layer 4 is interposed between the photoconductive layer 2 and the surface layer 3. The intermediate layer 4 includes nitrogen and boron doped therein.

The energy gap and the Fermi level of the intermediate layer 4 are easily controlled. More specifically, the intermediate layer 4 is a nitrogen and boron doped amorphous silicon (a-Si) layer. The energy gap becomes large as nitrogen is doped, and the Fermi level is controlled by doping boron in order to compensate for nitrogen. That is, an effective intermediate layer 4 is easily formed, which functions to ensure energy level matching between the photoconductive layer 2 and the surface layer 3.

If amorphous silicon (a-Si) is formed by the glow-discharge process, the characteristics of the amorphous silicon (a-Si) thin-film are greatly dependent on the apparatus in which the deposition is carried out. Thus, the film forming condition must be determined for each apparatus. However, the amorphous silicon (a-Si) including nitrogen and boron is suited for mass-production because the energy gap and the Fermi level are controllable by varying the addition ratio of nitrogen and boron.

The energy difference between the bottom of the conduction band of the surface layer 3 and the bottom of the conduction band of the intermediate layer 4 is preferably controlled to show a value less than 0.2 eV.

The above-mentioned energy difference corresponds to a barrier which the carrier formed by the photon must jump over to cancel the corona charges held on the surface of the photoreceptor.

Figure 1:
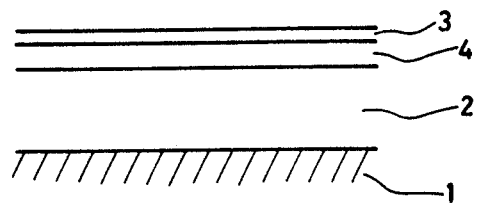
FIG. 1 is a schematic sectional view of an embodiment of an amorphous silicon (a-Si) photoreceptor of the present invention.
Figure 2:
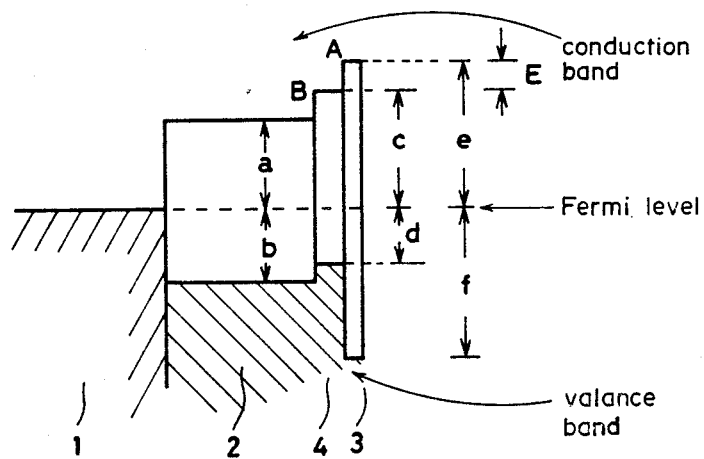
FIG. 2 is a schematic chart showing an energy band structure of the amorphous silicon (a-Si) photoreceptor of FIG. 1.

FIG. 2 schematically shows the energy band structure of the amorphous silicon (a-Si) photoreceptor of FIG. 1. The band gap value for each layer is obtained where a+b is the band gap for photoreceptor layer 2, c+d the band gap for intermediate layer 4, and e+f the band gap for the surface layer 3.

The actuation energy value is also obtained for each layer. This value corresponds to the energy gap from the Fermi level of the layer to either the conduction band or valence band, whichever is closer. The energy value b is the actuation energy of the photoreceptor 2, d is the actuation energy of the intermediate level 4, and e is the activation energy of the surface layer 3. The energy difference E between the bottom A of the conduction band of the surface layer 3 and the bottom B of the conduction band of the intermediate layer 4, determined by e-c, is selected to be less than or equal to 0.2 eV in accordance with the desire to minimize the barrier which a photon must jump to cancel corona charges on the surface of the photoreceptor layer.

EXAMPLE

Amorphous silicon (a-Si) which is the main component of the photoconductive layer is formed by the plasma CVD method, wherein the glow-discharged decomposition is conducted to monosilane gas ($SiH_4$). The deposition apparatus is the inductive coupling type, and the photoreceptor drum is held at the grounded level while the deposition is carried out. Radio frequency power of 13.56 MHz is applied to the coil via an impedence matching circuit. The reactive gas is introduced into the reaction chamber in such a manner that the flow amount thereof is controlled by a mass flow controller. The photoreceptor drum, on which the photoconductive layer is deposited, is maintained at about 250° to 300° C. in the reaction chamber. Nitrogen and boron are preferably added to the photoconductive layer 2 by a desired amount by means of the decomposition of ammonia ($NH_3$) and diborane ($B_2H_6$) gases. After the photoconductive layer 2 is formed to a thickness of about 20 μm, the intermediate layer 4 including nitrogen and boron, and the surface layer 3 including nitrogen and having a large energy gap are sequentially deposited on the photoconductive layer 2 in the same reaction chamber.

Each layer is formed in the following condition.

| Photoconductive Layer 2 | |
| --- | --- |
| $SiH_4$ flow amount (SCCM) | 80 |
| $NH_3$ flow amount (SCCM) | 4 |
| $B_2H_6$ (0.3% $H_2$ dilution) flow amount (SCCM) | 36 |
| RF Power (W) | 100 |
| substrate temperature (°C.) | 285 |
| thickness (μm) | 20 |
| Intermediate Layer 4 | |
| $SiH_4$ flow amount (SCCM) | 80 |
| $NH_3$ flow amount (SCCM) | 10 |
| $B_2H_6$ (0.3% $H_2$ dilution) flow amount (SCCM) | 100 |
| RF Power (W) | 100 |
| substrate temperature (°C.) | 285 |
| thickness (μm) | 1.0 |
| Surface Layer 3 | |
| $SiH_4$ flow amount (SCCM) | 40 |
| $NH_3$ flow amount (SCCM) | 80, 100, 150 |

| -continued | |
| --- | --- |
| RF Power (W) | 30 |
| substrate temperature (°C.) | 285 |
| thickness (μm) | 0.3 |

Mechanical peeling is never observed in the thus formed photoreceptor including the intermediate layer interposed between the photoconductive layer and the surface layer. The measured values of the activation energies of each layer in the above constructed photoreceptor are shown as follows through the use of the energy differences a through f shown in FIG. 2.

| | a | b | c | d | e | f |
| --- | --- | --- | --- | --- | --- | --- |
| (eV) | 0.87 | 0.74 | 1.12 | 0.53 | 1.2 | 1.5 |

The energy difference E is about 0.08 eV which is less than 0.2 eV. Clean copy is obtained when the surface layer 3 is formed under the condition wherein the $NH_3$ flow amount is 150 SCCM, and the surface layer 3 has a large energy gap. When the surface layer 3 is formed under the condition where the $NH_3$ flow amount is greater than or equal to 100 SCCM, the photoreceptor shows the dark charge potential of above 300 V which is sufficient for the electrophotography. The charge potential changes by below 10% after the aging test of 200,000 page copying operation. The following are the characteristics of the photoreceptor formed in the above-mentioned conditions.

| charging voltage | about 40 V/μm |
| --- | --- |
| dark decay time | about 10 sec. |
| half value exposure | 3 lx · s (at 45 lx white light exposure) |
| spectral sensitivity | peak sensitivity wavelength 700 nm |
| copyable pages | more than 200,000 |

Figure 3:
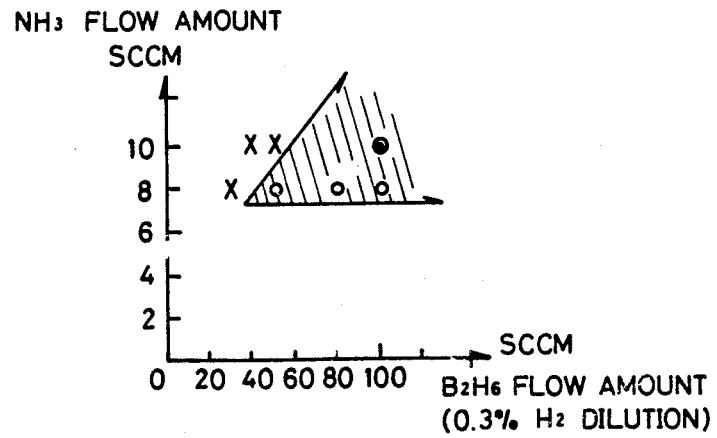
FIG. 3 is graph for explaining a manufacturing condition of the amorphous silicon (a-Si) photoreceptor of FIG. 1.

In the foregoing example, the intermediate layer 4 is formed under the condition where the $NH_3$ flow amount is 10 SCCM, and the $B_2H_6$ flow amount is 100 SCCM. When the intermediate layer 4 is formed by the inductive coupling type apparatus, a preferred photoreceptor is formed when the $NH_3$ flow amount (SCCM) and the $B_2H_6$ flow amount (SCCM: 0.3% $H_2$ dilution) are maintained in the range shown by the hatched portion in FIG. 3.

COMPARATIVE EXAMPLE

A comparative example is manufactured and the characteristics thereof are compared with those of the above-mentioned example of the present invention. In the comparative example, the surface layer is formed directly on the photoconductive layer without the intervention of the intermediate layer. The photoconductive layer of the comparative example is formed in the same condition as the example of the present invention, and the surface layer of the comparative example is formed in the following condition.

| Surface Layer of the Comparative Example | |
| --- | --- |
| $SiH_4$ flow amount (SCCM) | 40 |
| $NH_3$ flow amount (SCCM) | 40, 60, 80, 100, 150, 200 |
| RF Power (W) | 30 |
| substrate temperature (°C.) | 285 |

| -continued | |
|---|---|
| Surface Layer of the Comparative Example | |
| thickness (μm) | 0.3 |

The energy gap of the surface layer varies depending on the amount of nitrogen included therein. In this comparative example, the energy gap of the surface layer is about 2.2 through 3.4 eV. The comparative example exhibits a slight peeling on the surface thereof when the $NH_3$ flow amount is above 80 SCCM. The slight peeling precludes a clean copying operation. The copied image is blurred when the surface layer is formed under the condition wherein the $NH_3$ flow amount is 150 SCCM or 200 SCCM. The dark charge potential, which varies depending on the energy gap of the surface layer, is about less than 250 V when the $NH_3$ flow amount is below 80 SCCM. This is not sufficient to ensure the copying operation. The charge potential is reduced by more than 20% after the aging test of 10,000 page copying operation when the surface layer is formed under the condition where the $NH_3$ flow amount is 80 SCCM.

ANOTHER EXAMPLE

The photoreceptor of the present invention can be formed by a capacitive coupling type apparatus. The following is an example of the condition to form each layer in the capacitive coupling type apparatus. The photoreceptor shows similar characteristics as the photoreceptor of the above-mentioned example manufactured by the inductive coupling type apparatus.

| Photoconductive Layer 2 | |
|---|---|
| $SiH_4$ flow amount (SCCM) | 400 |
| $NH_3$ flow amount (SCCM) | 20 |
| $B_2H_6$ (0.3% $H_2$ dilution) flow amount (SCCM) | 50 |
| RF Power (W) | 800 |
| substrate temperature (°C.) | 280 |
| thickness (μm) | 18 |
| Intermediate Layer 4 | |
| $SiH_4$ flow amount (SCCM) | 400 |
| $NH_3$ flow amount (SCCM) | 50 |
| $B_2H_6$ (0.3% $H_2$ dilution) flow amount (SCCM) | 150 |
| RF Power (W) | 800 |
| substrate temperature (°C.) | 280 |
| thickness (μm) | 1.5 |
| Surface Layer 3 | |
| $SiH_4$ flow amount (SCCM) | 30 |
| $NH_3$ flow amount (SCCM) | 80 |
| RF Power (W) | 50 |
| substrate temperature (°C.) | 280 |
| thickness (μm) | 0.3 |

The invention being thus described, it will be obvious that the same may be varied in many ways. Such variations are not to be regarded as a departure from the spirit and scope of the invention, and all such modifications are intended to be included within the scope of the following claims.

What is claimed is:

1. A photoreceptor for electrophotograph comprising:
    a substrate of an electrically conductive material;
    a photoconductive layer formed on said substrate, the main component of said photoconductive layer being amorphous silicon (a-Si);
    an intermediate layer formed on said photoconductive layer,
    said intermediate layer being made of amorphous silicon (a-Si) including nitrogen and boron; and
    a surface layer formed on said intermediate layer, said surface layer being made of an amorphous material, and showing a large optical band gap, wherein the energy difference between the bottom of the conduction bands of said surface layer and said intermediate layer is less than 0.2 eV.

2. The photoreceptor of claim 1, wherein said photoconductive layer includes nitrogen and boron.

3. The photoreceptor of claim 2, wherein said surface layer includes nitrogen.

4. A photoreceptor for electrophotograph comprising:
    a substrate of an electrically conductive material;
    a photoconductive layer formed on said substrate, the main component of said photoconductive layer being amorphous silicon (a-Si), said photoconductive layer also containing nitrogen and boron;
    an intermediate layer being made of amorphous silicon (a-Si) including nitrogen and boron; and
    a surface layer formed on said intermediate layer said surface layer being made of an amorphous silicon containing nitrogen, wherein the energy difference between the bottom of the conduction band of said surface layer and the bottom of the conduction band of said intermediate layer is less than 0.2 eV.

5. The photoreceptor of claim 4 where said intermediate layer has a higher doping concentration of boron and nitrogen relative to the photoconductive layer.

6. The photoreceptor of claim 4 where said energy difference is about 0.08 eV.

7. A photoreceptor for electrophotograph comprising:
    a substrate of an electrically conductive material;
    a photoconductive layer formed on said substrate, the main component of said photoconductive layer being amorphous silicon (a-Si) containing hydrogen, said photoconductive layer also containing nitrogen and boron;
    an intermediate layer, formed on said photoconductive layer, being made of amorphous silicon (a-Si) containing hydrogen, said intermediate layer also containing nitrogen and boron; and
    a surface layer, formed on said intermediate layer, said surface layer being made of an amorphous silicon (a-Si) containing hydrogen, said surface layer also containing nitrogen, wherein the energy difference between the bottom of the conduction band of said surface layer and the bottom of the conduction band of said intermediate layer is less than 0.2 eV.

8. The photoreceptor of claim 7 wherein said intermediate layer has a higher doping concentration of boron and nitrogen relative to the photoconductive layer.

9. The photoreceptor of claim 7 wherein said energy difference is about 0.08 eV.

10. A photoreceptor for electrophotograph comprising:
    a substrate of an electrically conductive material;
    a photoconductive layer formed on said substrate, the main component being amorphous silicon (a-Si), said photoconductive layer also containing at least one material selected from the group consisting of hydrogen and nitrogen;

an intermediate layer formed on said photoconductive layer, being made of amorphous silicon (a-Si), said intermediate layer also containing nitrogen and boron; and a surface layer, formed on said intermediate layer, said layer being made of an amorphous silicon (a-Si), said surface layer also containing nitrogen, wherein the energy difference between the bottom of the conduction band of said surface layer and the bottom of the conductive band of said intermeditate layer is less than 0.2 eV.

* * * * *